United States Patent
Fort

(10) Patent No.: US 9,099,167 B2
(45) Date of Patent: Aug. 4, 2015

(54) CURRENT DETECTOR ALLOWING A LARGE SUPPLY VOLTAGE RANGE

(75) Inventor: Jimmy Fort, Puyloubier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 350 days.

(21) Appl. No.: 13/603,249

(22) Filed: Sep. 4, 2012

(65) Prior Publication Data

US 2013/0069623 A1 Mar. 21, 2013

(30) Foreign Application Priority Data

Sep. 21, 2011 (FR) ...................................... 11 58407

(51) Int. Cl.
- *G01R 19/00* (2006.01)
- *G11C 7/06* (2006.01)
- *G11C 16/26* (2006.01)

(52) U.S. Cl.
CPC ................ *G11C 7/067* (2013.01); *G11C 7/062* (2013.01); *G11C 16/26* (2013.01); *G11C 2207/063* (2013.01)

(58) Field of Classification Search
CPC .. G11C 16/26; G11C 2207/063; G11C 7/062; G11C 7/067; G11C 16/28
USPC ........ 324/76.11–76.83; 365/185.21, 207, 210
See application file for complete search history.

(56) References Cited

U.S. PATENT DOCUMENTS

| | | | | |
|---|---|---|---|---|
| 5,241,505 | A * | 8/1993 | Hashimoto | 711/102 |
| 6,351,416 | B2 * | 2/2002 | Fuchigami et al. | 365/185.21 |
| 6,642,791 | B1 * | 11/2003 | Balan | 330/253 |
| 6,906,957 | B2 * | 6/2005 | Conte et al. | 365/185.2 |
| 7,504,814 | B2 * | 3/2009 | Lee et al. | 323/316 |
| 2003/0095453 | A1 | 5/2003 | La Rosa | |
| 2008/0144367 | A1 * | 6/2008 | Dreesen et al. | 365/182 |

OTHER PUBLICATIONS

Baderna, D. et al., "A 1.2 V Sense Amplifier for High-Performance Embeddable NOR Flash Memories," IEEE International Symposium on Circuits and Systems, vol. 2, pp. 1266-1269, May 23-26, 2005.

* cited by examiner

*Primary Examiner* — Tung X Nguyen
*Assistant Examiner* — Raul Rios Russo
(74) *Attorney, Agent, or Firm* — Seed IP Law Group PLLC

(57) ABSTRACT

The disclosure relates to a method for detecting a current comprising: generating a bias current, transmitting the bias current to a feedback stage and a measurement stage connected to the measurement node receiving a current to be measured, slaving a voltage to the measurement node at a constant value by the measurement and feedback stages, transmitting to an output stage, a current circulating in the measurement stage, which depends on the bias current and the current to be measured, and converting a current circulating in the output stage into a voltage.

23 Claims, 3 Drawing Sheets

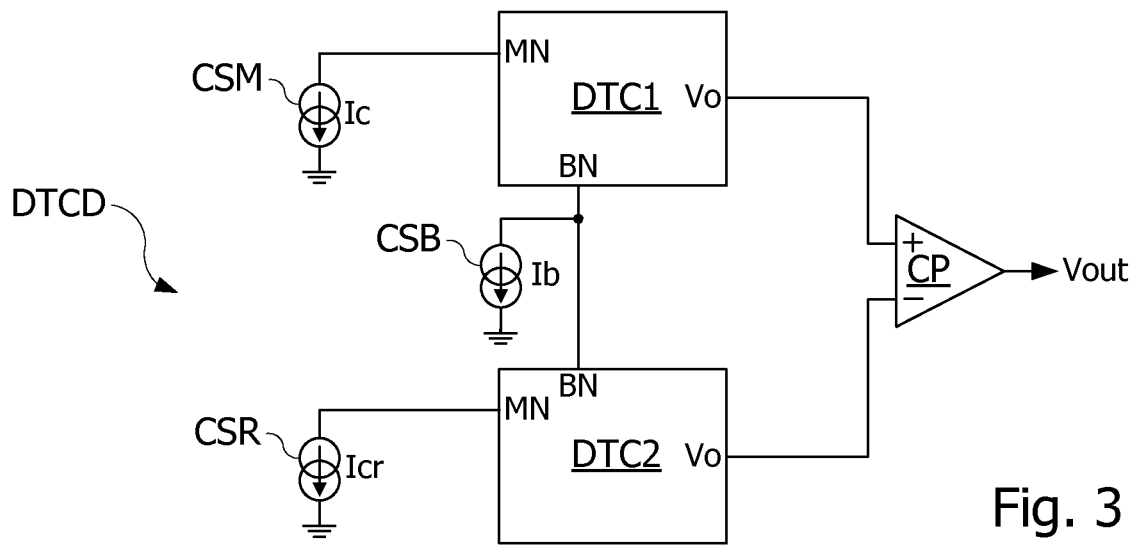
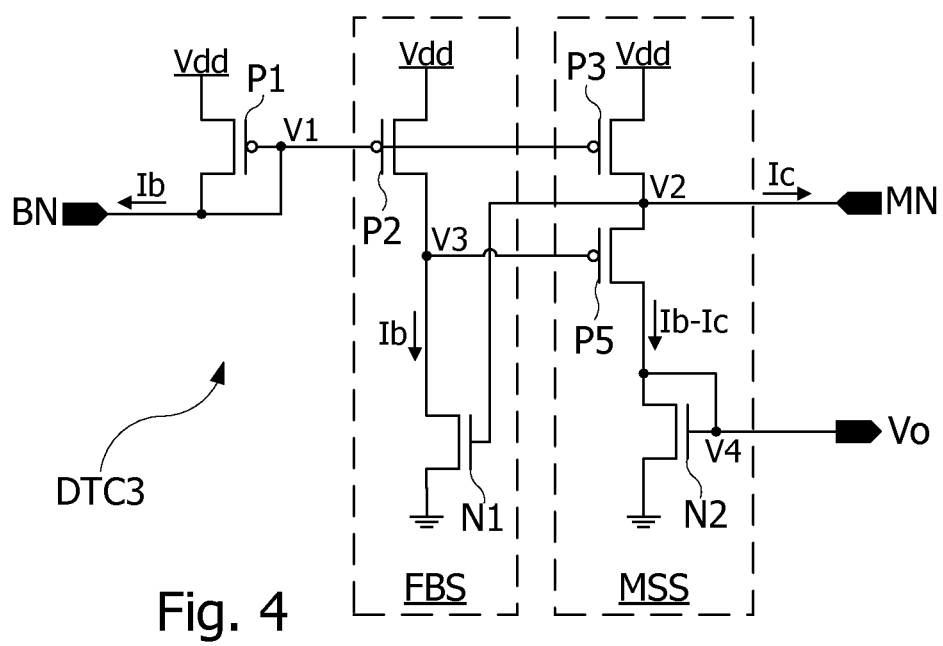

US 9,099,167 B2

CURRENT DETECTOR ALLOWING A LARGE SUPPLY VOLTAGE RANGE

BACKGROUND

1. Technical Field

The present disclosure relates to integrated circuits and in particular the detection and measurement of a current in such a circuit. The present disclosure applies in particular to current detection circuits or current sense amplifiers present in non-volatile memories to read the state of memory cells. The present disclosure more generally applies to any circuit in which a current must be detected or measured.

2. Description of the Related Art

Various battery-powered devices comprise a non-volatile memory such as an EEPROM or Flash memory. Such memories are also present in contactless integrated circuit cards, which are powered from electric signals picked up by their antennas. It is therefore desirable that volatile memories may operate in a wide supply voltage range and in particular at low supply voltages, and that their electrical consumption may be as low as possible. These objectives of supply voltage and electrical consumption are hard to reach when memory reading and writing operations are subjected to heavy constraints in terms of execution speed.

The reading speed of a memory is significantly affected by the speed performances of the memory sense amplifiers, which tend to decrease with the supply voltage. Reading a memory cell of a non-volatile memory generally involves converting a current coming from the memory cell into a voltage and comparing the voltage obtained to a reference voltage. The conversion of cell current into voltage is performed by a current detection circuit. An example of such a circuit is shown in FIG. 1.

In FIG. 1, the circuit comprises a reference branch, a measurement branch and a comparator CP1. The reference branch comprises a P-channel MOS transistor referred to as P11, an N-channel MOS transistor referred to as N11, an inverter I1 and a current source CS1 supplying a reference current Irf1. Transistor P11 comprises a source terminal receiving a supply voltage Vdd of the circuit, and gate and drain terminals connected to the drain of transistor N11. Transistor N11 comprises a source terminal connected to the ground through current source CS1 and connected to a gate terminal of transistor N11 through inverter I1. The measurement branch comprises a P-channel MOS transistor referred to as P12, an N-channel MOS transistor referred to as N12, an inverter 12 and a current source CS2 symbolizing the current to be detected or measured. Transistor P12 comprises a source terminal receiving a supply voltage Vdd of the circuit, and a gate terminal connected to the gate of transistor P11. Transistor P12 comprises a drain terminal connected to the drain terminal of transistor N12. Transistor N12 comprises a source terminal connected to the ground through current source CS2 and connected to a gate terminal of transistor N12 through inverter 12. The comparator CP1 compares the voltage present on the drain terminals of transistors P12 and N12 with the voltage present on the drain terminals of transistors P11 and N11 (or on the gate terminals of transistors P11 and P12), and supplies an output voltage Vout representative of the comparison result. Transistors P11, P12 form a current mirror having a transmission rate equal to one, to transmit all the current Irf1 circulating in the reference branch to the measurement branch. Transistors in cascode configuration with an inverter and a source follower stage with a unitary feedback loop are used to obtain a short precharge duration of the circuit in which the current must be measured, independent of the circuit capacitive load. The circuit of FIG. 1 allows a rapid precharge to be obtained independently of the capacitive load of the circuit whose current is to be measured, up to a supply voltage of 1.6 V. Below this value, the circuit in which the current is to be measured is not insufficiently biased, and the reading speed deteriorates.

There is therefore a need for a current detection or measurement circuit keeping good performances in terms of detection speed and electrical consumption, up to supply voltages lower than 1 V. There is also a need for a circuit which is simple and having low electrical energy consumption.

BRIEF SUMMARY

Embodiments relates to a method for detecting a current comprising: generating a bias current, transmitting the bias current to a feedback stage and a measurement stage connected to a measurement node receiving a current to be measured, slaving a voltage to the measurement node at a constant value by the measurement and feedback stages, transmitting to an output stage, a current circulating in the measurement stage, which depends on the bias current and the current to be measured, and converting a current circulating in the output stage into a voltage.

According to an embodiment, the method comprises transmitting a fraction of the bias current to the output stage.

According to an embodiment, the fraction of the bias current transmitted to the output stage is equal to the half According to an embodiment, the method comprises applying the steps of transmitting the bias current to the measurement, feedback and output stages, and slaving and measurement steps, to a reference current and the current to be measured, and a step of comparing the measures obtained.

According to an embodiment, the bias current is a reference current independent of a power supply voltage of the measurement, feedback and output stages.

Embodiments also relate to a current measurement circuit configured to implement the above-defined method.

According to an embodiment, the circuit comprises a bias stage transmitting a bias current, a measurement stage, a feedback stage and an output stage, the bias stage forming with each measurement and feedback stages a current mirror to transmit the bias current to the measurement stage and the feedback stage, the feedback stage and the measurement stage being connected and forming a slaving loop to maintain a voltage constant in a measurement node of the measurement stage.

According to an embodiment, the measurement stage forms with the output stage a current mirror to transmit to the output stage a difference between the bias current and a current to be measured taken from the measurement node.

According to an embodiment, the bias stage forms with the output stage a current mirror to transmit a fraction of the bias current to the output stage.

According to an embodiment, the bias stage forms with the output stage a current mirror to transmit a fraction of the bias current to the output stage, and the measurement stage forms with the output stage a current mirror to transmit to the output stage a current difference between the bias current and a current to be measured taken from the measurement node, the output stage supplying a voltage representative of a difference between the current difference and a fraction of the bias current.

According to an embodiment, the bias current comes from a reference current source insensitive to variations of a power supply voltage of the circuit.

According to an embodiment, the measurement stage comprises a P-channel MOS transistor through which a current passes, corresponding to a difference between the current to be measured and the bias current, the feedback stage comprising an N-channel MOS transistor through which the bias current passes, and controlled by a voltage present on the measurement node, the P-channel MOS transistor being controlled by a voltage present on a drain terminal of the N-channel MOS transistor.

According to an embodiment, the circuit comprises two identical measurement circuits, one receiving a reference current and the other a current to be measured, and a comparator to compare a reference current measure provided by one of the two measurement circuits, to a measure of the current to be measured provided by a second of the two measurement circuits.

Embodiments also relate to an integrated circuit comprising a measurement circuit as above-defined.

Embodiments also relate to a memory comprising current sense amplifiers complying with the measurement circuit as above-defined.

BRIEF DESCRIPTION OF THE SEVERAL VIEWS OF THE DRAWINGS

Embodiments of the disclosure will be described hereinafter, in relation with, but not limited to the appended figures wherein:

FIG. 3 schematically shows a current detection circuit, according to another embodiment;

FIG. 4 shows a circuit of the detection circuit of FIG. 3.

DETAILED DESCRIPTION

Figure 1:
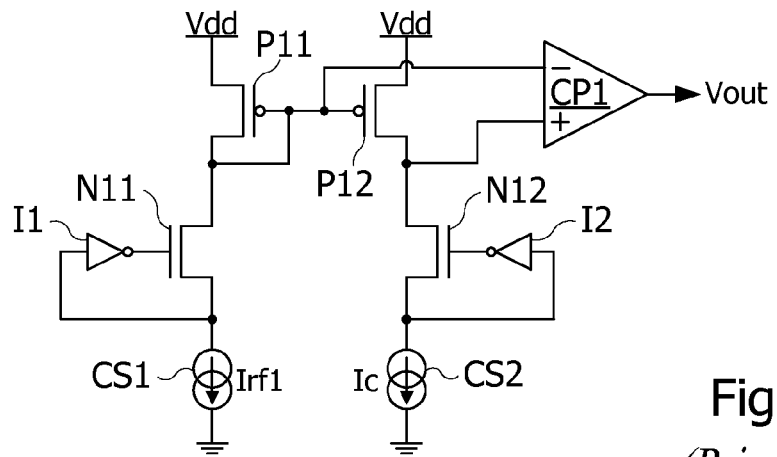
FIG. 1 previously described shows a current detection circuit, according to prior art.
Figure 2:
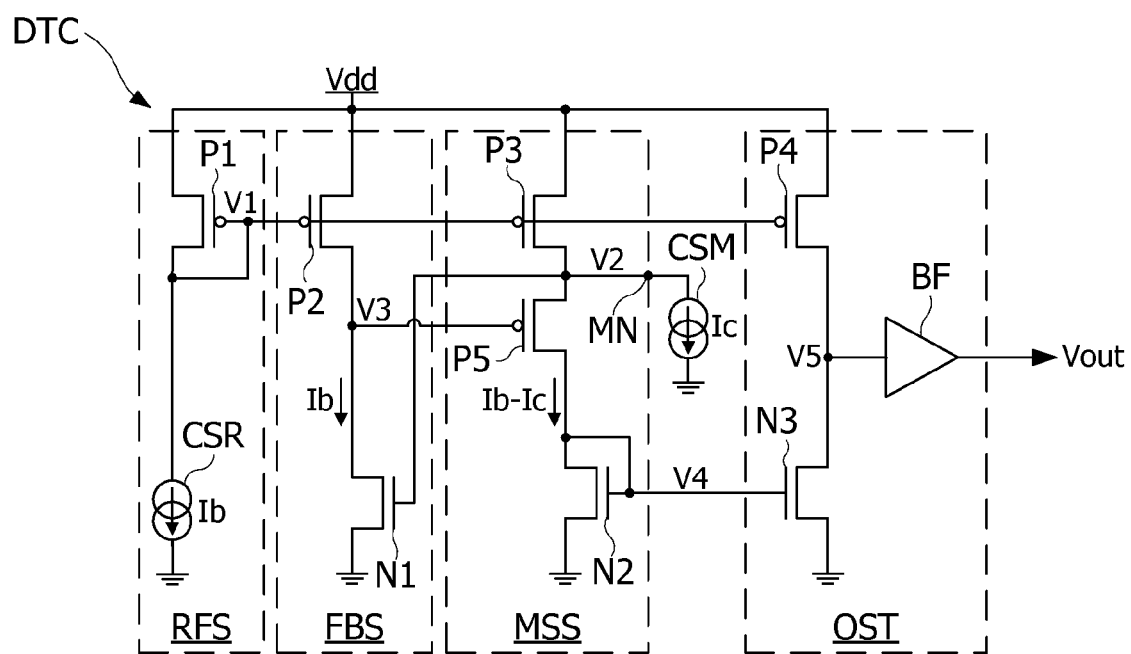
FIG. 2 shows a current detection circuit, according to one embodiment.

FIG. 2 shows a current detection circuit DTC, according to one embodiment. The circuit DTC comprises a reference stage RFS, a feedback stage FBS, a measurement stage MSS, and an output stage OST. The reference stage RFS comprises a P-channel MOS transistor, referred to as P1, and a bias current source CSR. Transistor P1 comprises a source terminal receiving a supply voltage Vdd of the circuit, and gate and drain terminals connected to the ground through current source CSR. The current source CSR is configured to generate a substantially constant bias current Ib independent of possible variations of the supply voltage Vdd. However, the current Ib may vary as a function of the circuit operating temperature and the circuit manufacture conditions.

The feedback stage FBS comprises a P-channel MOS transistor, referred to as P2, and an N-channel MOS transistor, referred to as N1, these two transistors forming an amplifier. Transistor P2 comprises a source terminal receiving the supply voltage Vdd, a gate terminal at a voltage V1, connected to the gate and drain terminals of transistor P1 and a drain terminal connected to a drain terminal of transistor N1. Transistor N1 comprises a source terminal connected to the ground.

The measurement stage MSS comprises two P-channel MOS transistors, referred to as P3, P5, and an N-channel MOS transistor, referred to as N2. Transistor P3 comprises a source terminal receiving the supply voltage Vdd, and a gate terminal connected to the gate terminals of transistors P1, P2. Transistor P3 also comprises a drain terminal at a voltage V2, connected to the gate terminal of transistor N1, to a source terminal of transistor P5 and a measurement node MN receiving a current to be measured Ic symbolized in the figure by a current source CSM. Transistor P5 comprises a gate terminal at a voltage V3, connected to the drain terminals of transistors P2 and N1, and a drain terminal at a voltage V4, connected to drain and gate terminals of transistor N2. Transistor N2 comprises a source terminal connected to the ground.

The output stage OST comprises a P-channel MOS transistor, referred to as P4, and an N-channel MOS transistor, referred to as N3, these two transistors forming an amplifier. The stage OST may also comprise a buffer circuit BF. Transistor P4 comprises a source terminal receiving the supply voltage Vdd, a gate terminal connected to the gate terminals of transistors P1, P2, P3, and a drain terminal at a voltage V5, connected to a drain terminal of transistor N3 and to the input of the buffer circuit BF. Transistor N3 comprises a gate terminal connected to the gate and drain terminals of transistors N2, and a source terminal connected to the ground. The circuit BF supplies an output voltage Vout depending on the voltage V5, which depends on the current to be measured Ic.

Transistors P2, P3, P4 form current mirrors with transistor P1. The width/length ratios of the channels of transistors P1, P2, P3 are chosen equal so that copies of the current Ib present on the drain terminal of transistor P1 are integrally transmitted to the drain terminals of transistors P2, P3. The current on the drain terminal of transistor P5 is therefore equal to Ib–Ic. If transistor P5 is conductive, it integrally transmits the current Ib–Ic to transistor N2. Transistors N2, N3 also form a current mirror. The width/length ratios of the channels of transistors N2, N3, are chosen equal so that a copy of the current Ib–Ic present on the drain terminal of transistor N2 is integrally transmitted to the drain terminal of transistor N3. The width/length ratio of the channel of transistor P4 is chosen equal to a 1/n fraction of the width/length ratio of the channel of transistor P1, so that the current transmitted by the drain terminal of transistor P4 is equal to a same fraction of the current Ib present on the drain of transistor P1, i.e., Ib/n. The result is that the current Ib-Ic transmitted by the current mirror formed by transistors N4 and N3 is compared to the current equal to Ib/n transmitted by the current mirror formed by transistors P1 and P4. In the example of FIG. 2, the width/length ratio of the channel of transistor P4 is chosen equal to half that of the channel of transistor P1, so that the current transmitted by the current mirror formed by transistors P1 and P4 is equal to half the current Ib. This current comparison makes a threshold current appear, equal to Ic=Ib–Ib/n (=Ib/2 if n=2). When the current Ic is lower than this threshold current, the current at the drain terminals of transistors P4 and N3 establishes at Ib/n, and voltage V5 establishes at the voltage between the drain and the source of transistor N3 (V5=VdsN3), this last voltage may be around one hundred millivolts. On the contrary, when the current Ic is higher than this threshold current, the current at the drain terminals of transistors P4 and N3 establishes at Ib–Ic, and the voltage V5 establishes at the supply voltage Vdd minus the voltage between the source and drain terminals of transistor P4 (V5=Vdd–VdsP4). Consequently, the output stage performs a current-voltage conversion.

In particular, the function of the circuit BF is to add gain to the current-voltage conversion. Circuit BF may be formed by two inverters in series. Circuit BF is configured to supply an output voltage Vout equal to zero when voltage V5 is lower than a threshold voltage of circuit BF which may be equal to Vdd/2, and a voltage Vout equal to voltage Vdd when voltage V5 is higher than Vdd/2.

If voltage V2 of the current measurement node MN decreases due to an increase of the current to be measured Ic, transistor N1 tends to become less conductive. The result is that voltage V3 on the drain terminal of transistor N1 increases with a significant gain as a function of the gain of the stage FBS. The increase of voltage V3 causes a decrease of the current going through transistor P5. Consequently, voltage V2 tends to increase. Similarly, a decrease of the current Ic and therefore of voltage V2 of the measurement node MN is compensated by an increase of voltage V3 on the gate of transistor P5. The result is that voltage V2 of the measurement node MN is maintained fixed by the slaving loop formed between transistors N1, P2 and P5, even if the current Ic varies. The measurement node MN therefore has very low impedance and voltage V2 corresponds to the voltage between the gate and source terminals of transistor N1. In addition, it is to be noted that voltage V2 is not sensitive to the variations of the supply voltage Vdd thanks to the current mirror formed by transistors P1 and P3.

During operation of the detection circuit DTC, a current circulates in the various branches of the circuit and in particular in the measurement stage MSS which comprises more transistors than the other stages RFS, FBS, OST. To that end, in one embodiment, the supply voltage Vdd is higher than a minimum voltage of 0.9 V corresponding to the sum of a minimum gate-source voltage of transistor N2 (around 0.5 V), a minimum drain-source voltage of transistor P5 (around 0.2 V) and a minimum saturation voltage of transistor P3 (around 0.2 V). The circuit DTC may also operate with a relatively high supply voltage Vdd, only limited by the breakdown voltage of transistors P1 to P4.

The rejection ratio of the supply voltage of circuit DTC is only linked to the corresponding ratio of current source CSR. Current source CSR may be of the type Proportional To the Absolute Temperature PTAT, Complementary To the Absolute Temperature CTAT, or Zero-dependence To the Absolute Temperature ZTAT.

The output circuit of the measurement circuit DTC may be modified in several ways. Thus, according to one embodiment, the gate terminal of transistor P4 may simply be grounded instead of being connected to the gate terminal of transistor P1. In this case, a voltage different from zero appears at the output Vout of circuit BF when the current Ic is higher than the current Ib. According to another embodiment, the current Ib−Ic on the drain terminal of transistor N3 or P5 may be used by another circuit configured to supply a voltage whose value depends on the value of the current Ib−Ic.

FIG. 3 shows a current detection circuit DTCD, according to another embodiment. The circuit DTCD comprises two identical current detection circuits DTC1, DTC2. Each circuit DTC1, DTC2 comprises a bias node BN connected to a common bias current source CSB, supplying the bias current Ib. Each circuit DTC1, DTC2 comprises a measurement node MN. The node MN of circuit DTC2 is connected to a reference current source CSR supplying a measurement reference current Icr. In the case of a memory, the current Icr may be that obtained with a reference memory cell in a known programmed or erased state. The node MN of circuit DTC2 is connected to the current source CSM supplying the current to be detected or measured Ic. Each circuit DTC1, DTC2 supplies an output voltage Vo representative of the current Ic, Icr received on their measurement node MN. The circuit DTCD comprises a comparator CP receiving in input the output voltages Vo of circuits DTC1, DTC2 and supplying an output voltage Vout representative of the difference between the output voltages of circuits DTC1, DTC2, and therefore the difference between the currents Ic and Icr.

According to one embodiment, circuits DTC1, DTC2 are identical to the circuit DTC shown in FIG. 2. The current source Ib is not necessarily fixed or stable or independent of the supply voltage Vdd of circuits DTC1, DTC2. Indeed, the comparator CP compares the voltages representative of the currents Ib−Icr and Ib−Ic, i.e., supplies a signal representative of the current (Ib−Icr)−(Ib−Ic) which is equal to Ic−Icr, this value being independent of the current Ib.

According to another embodiment, circuits DTC1, DTC2 are identical to the circuit DTC3 shown in FIG. 4. Circuit DTC3 differs from the circuit DTC shown in FIG. 2 in that it does not comprise the output stage OST comprising transistors P4 and N3. Thus, the output voltage Vo of circuit DTC3 corresponds to the voltage V4 taken from the gate and drain of transistor N2.

Figure 5:
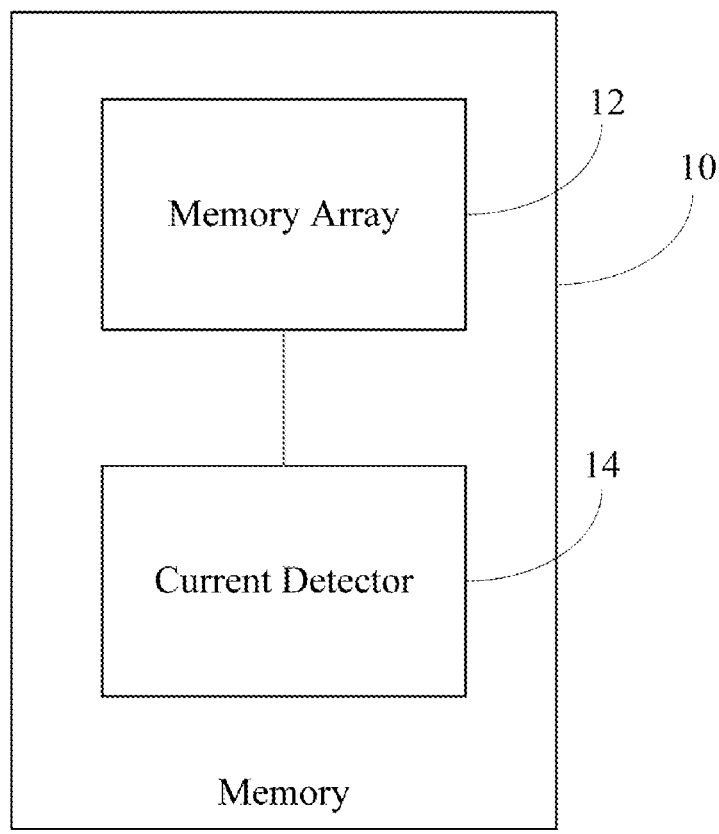
FIG. 5 is a schematic diagram of a memory according to one embodiment of the present disclosure.

A schematic diagram of a memory 10 according to one embodiment of the present disclosure is shown in FIG. 5. The memory 10 includes a memory array 12 and a current detector 14 that acts as a sense amplifier to determine memory states of memory cells of the memory array. The current detector 14 may be implemented using any of the current detectors DTC, DTCD, DTC3 discussed above and shown in FIGS. 2-4. In particular, the current IC to be detected using the current detectors DTC, DTCD, DTC3 may be the current through an accessed memory cell of the memory array 12 and the current Icr may be a reference current that is compared to the memory cell current Ic in order to determine the value stored in the memory cell. Of course, the depiction in FIG. 5 is highly schematic, and the memory 10 may include numerous other parts that are not shown, such as column and row decoders, bias circuits, etc. and may include multiple current detectors 14 acting as sense amplifiers.

The memory 10 may be a non-volatile memory, such as an EEPROM or Flash memory, or any other type of memory that can be read using a current detector such as the current detector 14. The memory 10 can be included in numerous different devices, such as various battery-powered devices or in contactless integrated circuit cards, which are powered from electric signals picked up by their antennas.

It will be clear to those skilled in the art that the present disclosure is susceptible of various embodiments and applications. In particular, the disclosure is not limited to the circuits previously described. Indeed, these circuits may be easily modified by those skilled in the art.

In addition, the disclosure does not necessarily apply to current sense amplifiers present in EEPROM and Flash memories, but may apply to any circuit in which a current is to be detected or measured. Thus, the disclosure may for example apply to circuits comprising a sensor such as a photodetector, supplying a current as a function of an electromagnetic radiation received by the photodetector.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for detecting a current, comprising:
receiving a current to be measured at a first measurement node;
providing a first bias current to a first feedback stage;

providing a second bias current to a first measurement stage coupled to the first measurement node;
slaving a first voltage at the first measurement node to a substantially constant value by the measurement and feedback stages; and
converting into a voltage a current flowing in the first measurement stage, wherein the current flowing in the first measurement stage depends on the second bias current and the current to be measured.

2. The method of claim 1, further comprising:
reflecting to a first output stage the current flowing in the first measurement stage; and
converting into a first output voltage a current flowing in the first output stage.

3. The method of claim 2, further comprising reflecting a fraction of the second bias current to the output stage.

4. The method of claim 3, wherein the fraction of the second bias current reflected to the output stage is equal to one half.

5. The method of claim 2, further comprising:
providing a third bias current to a second feedback stage;
providing a fourth bias current to a second measurement stage coupled to a second measurement node configured to receive a reference current;
slaving a second voltage to the second measurement node to a substantially constant value by the second measurement and feedback stages;
reflecting, to a second output stage, a current flowing in the second measurement stage, wherein the current flowing in the second measurement stage depends on the fourth bias current and the reference current;
converting a current flowing in the second output stage into a second output voltage; and
comparing the first and second output voltages to each other.

6. The method of claim 2, further comprising generating a third bias current independent of a power supply voltage of the first measurement, feedback and output stages, wherein providing the first bias current includes reflecting the third bias current to the first feedback stage and providing the second bias current includes reflecting the third bias current to the first measurement stage.

7. A current measurement circuit, comprising:
a first measurement node configured to receive a current to be measured;
a first feedback circuit coupled to the first measurement node, the first feedback circuit including a first current source configured to provide a first bias current; and
a first measurement stage coupled to the first measurement node and including a second current source configured to provide a second bias current, the first feedback circuit and first measurement stage forming a first slaving loop configured to slave a first voltage at the first measurement node to a substantially constant value, the first measurement stage being configured to convert, to a voltage, a current in the first measurement stage that depends on the second bias current and the current to be measured.

8. The circuit of claim 7, further comprising a bias stage configured to generate a reference bias current, the bias stage forming with the first measurement stage and the first feedback circuit a first current mirror configured to produce the first and second bias currents based on the reference bias current.

9. The circuit of claim 8, further comprising:
a first output stage coupled to the first measurement stage, the first measurement stage and the first output stage being configured to reflect, to the first output stage, the current in the first measurement stage that depends on the second bias current and the current to be measured, the first output stage being configured to convert a current flowing in the first output stage into a first output voltage.

10. The circuit of claim 9, wherein the first measurement stage forms with the first output stage a second current mirror configured to reflect to the first output stage a difference between the second bias current and the current to be measured.

11. The circuit of claim 10, wherein the first bias stage forms with first the output stage a third current mirror configured to reflect a fraction of the reference bias current to the output stage.

12. The circuit of claim 9, wherein:
the first bias stage forms with the output stage a second current mirror configured to reflect a fraction of the bias current to the output stage;
the first measurement stage forms with the output stage a third current mirror configured to transmit to the output stage a current difference between the second bias current and the current to be measured; and
the first output stage is configured to supply the first output voltage representative of a difference between the current difference and the fraction of the reference bias current.

13. The circuit of claim 8, wherein the bias stage includes a reference current source insensitive to variations of a power supply voltage of the circuit.

14. The circuit of claim 7, wherein:
the first measurement stage comprises a P-channel MOS transistor coupled to the first measurement node and configured to pass a current corresponding to a difference between the current to be measured and the second bias current;
the feedback stage includes an N-channel MOS transistor configured to pass the first bias current, and configured to be controlled by the first voltage on the measurement node, the N-channel MOS transistor having a drain terminal configured to control the P-channel MOS transistor.

15. The circuit of claim 7, further comprising:
a first output stage coupled to the first measurement stage, the first measurement stage and the first output stage being configured to reflect, to the first output stage, the current in the first measurement stage that depends on the second bias current and the current to be measured, the first output stage being configured to convert a current flowing in the first output stage into a first output voltage;
a second measurement node configured to receive a reference current;
a second feedback circuit coupled to the second measurement node; and
a second measurement stage coupled to the second measurement node, the second feedback circuit and second measurement stage forming a second slaving loop configured to slave a second voltage at the second measurement node to a substantially constant value, the second measurement stage being configured to convert, to a voltage, a current in the first measurement stage that depends on the second bias current and the current to be measured;
a second output stage coupled to the second measurement stage, the second measurement stage and the second output stage being configured to reflect, to the first output stage, the current in the second measurement stage that depends on the second bias current and the reference current, the second output stage being configured to convert a current flowing in the second output stage into a second output voltage; and a comparator configured to compare the first and second output voltages to each other.

16. A memory comprising:

a memory array; and a current sense amplifier coupled to the memory array and including:

a measurement node configured to receive a current to be measured;

a feedback circuit coupled to the measurement node, the feedback circuit including a first current source configured to provide a first bias current; and a measurement stage coupled to the measurement node and including a second current source configured to provide a second bias current, the feedback circuit and first measurement stage forming a slaving loop configured to slave a first voltage at the first measurement node to a substantially constant value, the measurement stage being configured to convert, to a voltage, a current in the measurement stage that depends on the second bias current and the current to be measured.

17. The memory of claim 16, further comprising a bias stage configured to generate a reference bias current, the bias stage forming with the measurement stage and the feedback circuit a current mirror configured to produce the first and second bias currents based on the reference bias current.

18. The memory of claim 16, further comprising:

an output stage coupled to the measurement stage, the measurement stage and output stage being configured to reflect, to the output stage, the current in the measurement stage that depends on the second bias current and the current to be measured, the output stage being configured to convert a current flowing in the output stage into an output voltage.

19. The memory of claim 16, wherein:

the first measurement stage comprises a P-channel MOS transistor coupled to the first measurement node and configured to pass a current corresponding to a difference between the current to be measured and the second bias current;

the feedback stage includes an N-channel MOS transistor configured to pass the first bias current, and configured to be controlled by the first voltage on the measurement node, the N-channel MOS transistor having a drain terminal configured to control the P-channel MOS transistor.

20. A current measurement circuit, comprising:

first and second supply terminals;

a measurement node configured to receive a current to be measured;

a feedback circuit that includes a first current source electrically coupled with a first transistor between the first and second supply terminals, the first transistor including a control terminal electrically coupled to the measurement node, and the first current source being electrically coupled to the first transistor by a first intermediate node; and a measurement stage including a second current source electrically coupled between the first supply terminal and the measurement node, and a second transistor electrically coupled between the measurement node and the second supply terminal, the second transistor having a control terminal electrically coupled to the first intermediate node.

21. The current measurement circuit of claim 20, wherein the first current source is configured to provide a first bias current, the second current source is configured to provide a second bias current, and the measurement stage includes a third transistor electrically coupled with the second transistor between the measurement node and the second supply terminal, the second and third transistors being coupled to one another being a second intermediate node, and the measurement stage is configured to produce a voltage at the second intermediate node that corresponds to a difference between the second bias current and the current to be measured.

22. The current measurement circuit of claim 20, further comprising a bias stage configured to generate a reference bias current, the bias stage forming with the measurement stage and the feedback circuit a current mirror configured to produce the first and second bias currents based on the reference bias current.

23. The current measurement circuit of claim 20, further comprising:

an output stage coupled to the measurement stage, the measurement stage and output stage being configured to reflect, to the output stage, the current in the measurement stage that depends on the second bias current and the current to be measured, the output stage being configured to convert a current flowing in the output stage into an output voltage.

\* \* \* \* \*